TRANSISTORIZED VOLTAGE TUNABLE OSCILLATOR

Filed July 25, 1966

INVENTOR
HANS KELLER
BY Percy P. Lantzy
ATTORNEY 3,370,254
TRANSISTORIZED VOLTAGE TUNABLE OSCILLATOR Hans Keller, Freiberg im Breisgau, Germany, assignor to International Standard Electric Corporation, New York, N.Y., a corporation of Delaware Filed July 25, 1966, Ser. No. 567,414
Claims priority, application Germany, Aug. 3, 1965, J 28,707
4 Claims. (Cl. 331—117)

ABSTRACT OF THE DISCLOSURE

The output amplitude of a transistor oscillator, tuned by a voltage variable capacitor diode, is maintained constant by a feedback path including, in one form, a fixed capacitor coupled between the emitter and a first junction, to which the control voltage is coupled, between a series connected fixed resistor and a first variable capacitor diode forming part of a parallel inductor-capacitor resonant circuit, and, in another form, a fixed capacitor connected in series with a second variable capacitor diode coupled between the emitter and collector, the junction of these two latter components being coupled to the first junction.

This invention relates to tunable oscillator circuits and more particularly to transistorized tunable oscillator circuits utilizing capacitive feedback and a variable resonant circuit comprising a voltage-dependent capacitance in which the output amplitude is maintained substantially constant independent of the tuning.

The use of voltage dependent capacitances for tuning LC-resonant circuits is well known in the art. These resonant circuits are tuned by means of a variable D.C. bias voltage fed to a variable capacitor diode (the voltage dependent capacitance) for changing the capacitance thereof. In a simple circuit arrangement frequently used as a high frequency oscillator (i.e., in television tuners), a transistor is operated in the common base configuration and is conventionally fed back via a fixed capacitor coupled between the collector and the emitter electrodes of the transistor. A disadvantage of this type of circuit is that the losses in a variable capacitor diode (voltage dependent capacitance) are high, and furthermore, these losses are dependent on the magnitude of the bias voltage applied thereto. This causes loading down of the output circuit of the oscillator. More particularly, as the capacitance of the variable capacitor diode is made higher by application of the bias voltage the loading on the output circuit of the oscillator increases. Therefore, the amplitude of the oscillator output drops due to this increased loading caused by the changing of the capacitance of the variable capacitor diode, the drop in amplitude increasing with decreasing tuning frequency.

Therefore, the main object of this invention is to provide an electronically tunable transistorized oscillator comprising variable feedback means for changing the feedback factor in accordance with the changing of the resonant circuit tuning capacitance, thereby providing a substantially constant output amplitude over a wide frequency range.

According to this invention a transistorized electronically tunable oscillator circuit comprises a transistor having at least first, second and third electrodes, capacitive feedback means coupled between said first and second electrodes, a variable frequency resonant circuit further coupled to said second electrode, said resonant circuit including an inductance and a first voltage dependent capacitive means and variable reactance means further coupled to said feedback means to change the feedback factor in accordance with variations in the resonant circuit tuning.

The above-mentioned and other features and objects of this invention will become apparent by reference to the following description taken in conjunction with the accompanying drawings, in which.

Figure 1:
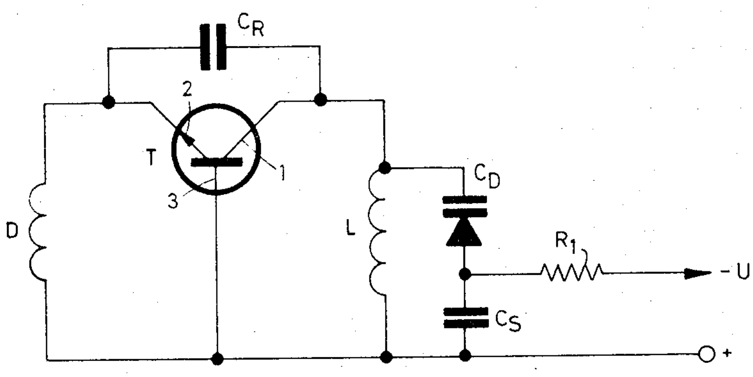
Fig. 1 PRIOR ART
FIGURE 1 illustrates a tunable oscillator circuit presently known in the art.

Referring now to FIGURE 1, a circuit configuration illustrating the prior art is shown. The D.C. voltage sources and bias circuitry which determine the transistor operating point are not shown in the drawings for the sake of simplicity. A variable frequency resonant circuit comprising an inductance L coupled in parallel with the series combination of fixed capacitance $C_S$ and voltage dependent capacitance $C_D$ is coupled to the collector 1 of transistor T. The voltage dependent capacitance $C_D$ may comprise a variable capacitor diode whose capacitance is a function of the D.C. bias voltage applied thereto. Coupled to the junction of capacitors $C_S$ and $C_D$ via resistor R1 is D.C. bias voltage source U. The bias voltage U is for tuning the resonant frequency of said resonant circuit by varying the D.C. bias on voltage dependent capacitance $C_D$. The feedback circuit comprises a fixed capacitor $C_R$ coupled between the collector 1 and the emitter 2 of transistor T. Coupled between the emitter 2 and base 3 of transistor T is a coil D which is included for phase correction. The collector electrode 1 is shown coupled to one end end of coil L but it should be noted that it may be also connected at any tap point along coil L.

In the circuit of FIGURE 1 as the tuning of the resonant circuit comprising coil L and capacitors $C_D$ and $C_S$ is varied by means of varying bias voltage source U, the loading on the collector circuit of the transistor is also varied due to changing losses in variable capacitor diode $C_D$. This in turn causes the output amplitude of the oscillator to also vary. In order to correct for this variation in output amplitude due to varying losses in the tunable resonant circuit, the circuit of FIGURES 2 and 3 have been devised.

Figure 2:
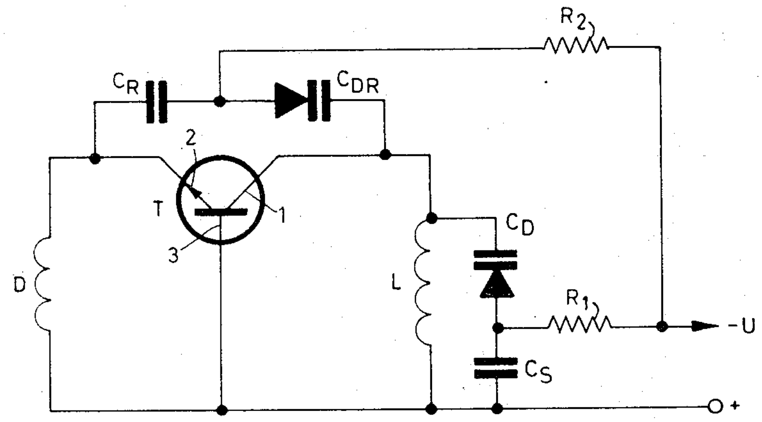
FIGURE 2 illustrates one embodiment of a tunable oscillator according to this invention.

Referring now to FIGURE 2 there is shown an oscillator according to this invention which is similar to that of FIGURE 1 but which further comprises a second voltage dependent capacitance $C_{DR}$ coupled in series with the fixed feedback capacitor $C_R$. Further included in the circuit of FIGURE 2 is a resistor $R_2$ coupled between bias voltage source U and the junction point between capacitors $C_R$ and $C_{DR}$. Bias source U now also applies a D.C. bias to voltage dependent capacitance $C_{DR}$ as well as to voltage dependent capacitance $C_D$. Now the feedback factor is dependent on the same bias voltage U which varies the tuned frequency of the resonant circuit in order that the transistor T will provide an output signal which increases as the resonant circuit losses increase. This serves to maintain the output signal of the oscillator substantially constant over a wide range of frequencies.

It is clear that the voltage dependent capacitances $C_D$ and $C_{DR}$ must be chosen so that their characteristics complement each other in that as the losses in one capacitance increase, the feedback factor is changed accordingly in order to properly compensate therefor.

In the circuit of FIGURE 2, it is also possible to utilize another bias source instead of source U for the variable capacitor diode $C_{DR}$ as long as the voltage chosen varies in the same sense as that applied to $C_D$. This may be a desirable alternative arrangement, depending upon the particular components used in the circuit.

Figure 3:
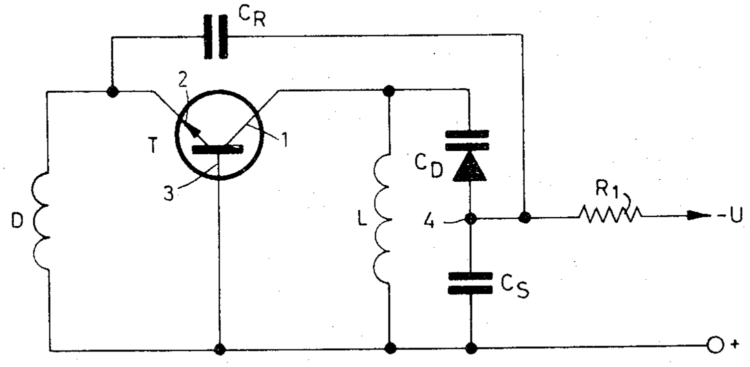
FIGURE 3 illustrates another embodiment of a tunable oscillator circuit according to this invention.

Referring now to FIGURE 3 another circuit according to this invention is illustrated which provides a substantially constant output signal level over a range of frequencies. In this circuit the fixed feedback capacitor $C_R$ is coupled between the emitter electrode 2 of transistor T and the junction point between capacitors $C_S$ and $C_D$. Capacitors $C_S$ and $C_D$ form a variable voltage divider with respect to capacitor $C_R$. Therefore, as the bias voltage source U is varied in order to vary capacitor $C_D$, thereby changing the tuning of the circuit, the voltage appearing at the tap point 4 of the capacitive voltage divider varies accordingly. For example, as the capacitance of capacitor $C_D$ is increased the A.C. voltage at the voltage divider tap point 4 also increases, thereby providing a larger feedback voltage and compensating for the increased losses in voltage dependent capacitance $C_D$. In other words, as the frequency output of the amplifier is lowered by means of bias source U the power output from transistor T fed to the resonant circuit is caused to increase by means of the changing feedback factor in order to maintain the output substantially constant.

An advantage of the circuit of FIGURE 3 over that of FIGURE 2 is that only one voltage dependent capacitance is required. This of course will lower the cost of the system of FIGURE 3. But, a disadvantage of the circuit of the circuit of FIGURE 3 is that the fixed capacitor $C_S$ must be properly chosen in relation to the maximum capacitance of the voltage dependent capacitance $C_D$ whereas in FIGURE 2 the fixed capacitor $C_S$ could be chosen at random.

In summary, it is seen that circuits according to this invention automatically vary the feedback factor in the same sense as the variations of tuning capacitance in order to maintain the output amplitude of the oscillator substantially constant. This variation of the feedback factor substantially eliminates the loading effects caused by the variable losses in the voltage dependent capacitances as the capacitances thereof are changed in order to vary the frequency of operation of the oscillator circuit.

While I have described above the principles of my invention in connection with specific apparatus, it is to be clearly understood that this description is made only by way of example and not as a limitation to the scope of my invention as set forth in the accompanying claims.

I claim:

1. A transistorized voltage tunable oscillator comprising:

a transistor having:

an emitter electrode, a collector electrode and a base electrode;

a voltage variable frequency resonant circuit including an inductor coupled between said collector electrode and said base electrode, and a series circuit coupled in parallel to said inductor including:

a first fixed capacitor, and a first voltage variable capacitance means;

a source of frequency control voltage coupled to the junction of said first capacitor and said first capacitance means;

a second fixed capacitor coupled between said emitter electrode and said junction of said first capacitor and said first capacitance means; and a second voltage variable capacitance means coupled in series between said second capacitor and said collector electrode, the junction of said second capacitor and said second capacitance means being coupled to said junction of said first capacitor and said first capacitance means.

2. An oscillator according to claim 1, wherein:

said first capacitance means includes:

a first variable capacitor diode.

3. An oscillator according to claim 1, wherein:

said second capacitance means includes:

a second variable capacitor diode.

4. An oscillator according to claim 6, wherein:

each of said first and second capacitance means includes:

a variable capacitor diode.

References Cited

UNITED STATES PATENTS

| | | | |
|---|---|---|---|
| 2,543,891 | 3/1951 | Carlson et al. | 331—170 |
| 3,316,498 | 4/1967 | Doble et al. | 331—36 |

FOREIGN PATENTS

| | | |
|---|---|---|
| 1,025,979 | 4/1966 | Great Britain. |

OTHER REFERENCES

Hammerslag, Electronics, "Circuit Design V Sing Silicon Capacitors," p. 49, Sept. 18, 1959.

Straube, Electronic Industries, "A Voltage Variable Capacitor," p. 77, July 1958.

JOHN KOMINSKI, *Primary Examiner.*

ROY LAKE, *Examiner.*